United States Patent
Zhu et al.

(10) Patent No.: US 6,872,993 B1
(45) Date of Patent: Mar. 29, 2005

(54) THIN FILM MEMORY DEVICE HAVING LOCAL AND EXTERNAL MAGNETIC SHIELDING

(75) Inventors: Theodore Zhu, Maple Grove, MN (US); Jeffrey S. Sather, Medina, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/318,073

(22) Filed: May 25, 1999

(51) Int. Cl.$^7$ ............................................. H01L 29/80
(52) U.S. Cl. .................. 257/259; 257/659; 365/158; 365/171
(58) Field of Search .................. 365/158, 162, 365/171–174; 257/259, 659, 295

(56) References Cited

U.S. PATENT DOCUMENTS

| | | | |
|---|---|---|---|
| 3,623,032 A | * 11/1971 | Schapira | 340/174 BC |
| 3,623,035 A | * 11/1971 | Kobayashi et al. | 340/174 BC |
| 5,432,734 A | * 7/1995 | Kawano et al. | 365/158 |
| 5,661,062 A | 8/1997 | Prinz | |
| 5,861,328 A | 1/1999 | Tehrani et al. | |
| 5,902,690 A | 5/1999 | Tracy et al. | |
| 5,940,319 A | 8/1999 | Durlam et al. | |
| 5,956,267 A | 9/1999 | Hurst et al. | |
| 6,048,739 A | 4/2000 | Hurst et al. | |
| 6,165,803 A | 12/2000 | Chen et al. | |
| 6,510,078 B2 | 1/2003 | Schwarzl | |
| 6,580,636 B2 | 6/2003 | Thewes et al. | |
| 2001/0030886 A1 | 10/2001 | Thewes et al. | |
| 2001/0050859 A1 | 12/2001 | Schwarzl | |

OTHER PUBLICATIONS

Wang et al., Feasibility of Ultra–Dense Spin–Tunneling Random Access Memory, IEEE Transactions on Magnetics, vol. 33, No. 6, Nov. 1997.

Lee, Chih–Ling, "A Study of Magnetoresistance Random–Access Memory," date unknown.

Kaakani, H. "Non–Volatile Memory (MRAM) ANXXX," [online], Honeywell, Mar. 1999 [retrieved on Nov. 19, 2001]. Retrieved from the Internet: <URL: www.ssec.honeywell.com/avionics/h_gmr.pdf>.

* cited by examiner

*Primary Examiner*—Nathan J. Flynn
*Assistant Examiner*—Leonardo Andújar
(74) *Attorney, Agent, or Firm*—Knobbe, Martens, Olson & Bear, LLP

(57) ABSTRACT

A monolithically formed ferromagnetic thin-film memory is disclosed that has local shielding on at least two sides of selected magnetic storage elements. The local shielding preferably extends along the back and side surfaces of a word line and/or digital lines of a conventional magnetic memory. In this configuration, the local shielding not only may help reduce externally generated EMI, internally generated cross-talk and other unwanted fields in the magnetic bit region, but may also help enhance the desired magnetic fields in the bit region.

21 Claims, 8 Drawing Sheets

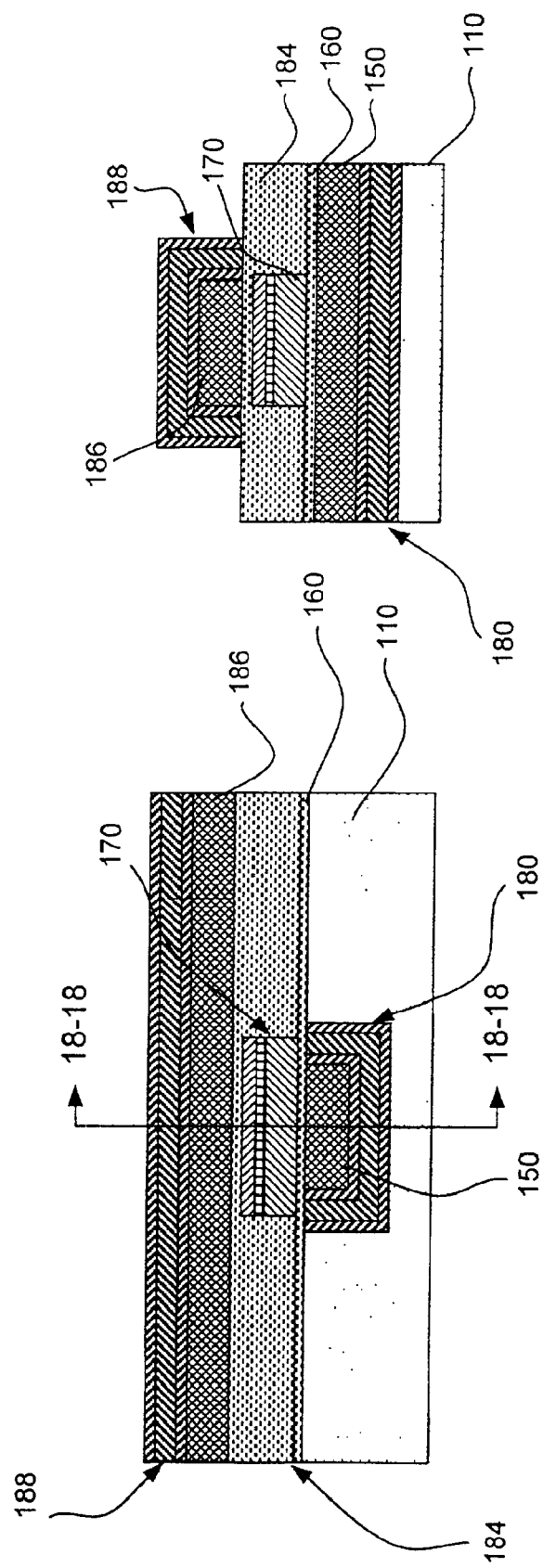

THIN FILM MEMORY DEVICE HAVING LOCAL AND EXTERNAL MAGNETIC SHIELDING

CROSS REFERENCE TO CO-PENDING APPLICATIONS

This is a continuation-in-part application of U.S. patent application Ser. No. 08/993,009, filed Dec. 18, 1997, and entitled "Self-Aligned Wordline Keeper and Method of Manufacture Therefor".

The present application is related to U.S. patent application Ser. No. 08/993,005 filed Dec. 18, 1997, entitled "HIGH DENSITY MAGNETIC MEMORY DEVICE AND METHOD OF MANUFACTURE THEREFOR" and U.S. patent application Ser. No. 08/993,009 filed Dec. 18, 1997, entitled "SELF-ALIGNED WORDLINE AND METHOD OF MANUFACTURE THEREOF", which are assigned to the assignee of the present invention and incorporated herein by reference.

This invention was made with Government support under Contract Number N00014-96-2114 awarded by NRL (Naval Research Laboratory). The Government has certain rights in this invention.

BACKGROUND OF THE INVENTION

The present invention generally relates to ferromagnetic thin film memory devices and sensors, and more particularly, to shielding for such thin film ferromagnetic memory devices and sensors.

Digital memories of various kinds are used extensively in computer and computer system components, digital processing systems and the like. Such memories can be formed, to considerable advantage, based on the storage of digital bits as alternative states of magnetization of magnetic materials in each memory cell, typically thin-film materials. These films may be thin ferromagnetic films having information stored therein based on the direction of the magnetization occurring in those films. The information is typically obtained either by inductive sensing to determine the magnetization state, or by magneto-resistive sensing of each state.

Such ferromagnetic thin-film memories may be conveniently provided on the surface of a monolithic integrated circuit to thereby provide easy electrical interconnection between the memory cells and the memory operating circuitry on the monolithic integrated circuit. When so provided, it is desirable to reduce the size and increase the packing density of the ferromagnetic thin-film memory cells to achieve a significant density of stored digital bits.

Typically, a thin-film magnetic memory includes a number of sense lines intersected by a number of word lines. At each intersection, a thin film of magnetically coercive material is provided. The magnetic material forms a magnetic memory cell in which a bit of information is stored. A number of digital lines may also be provided. The digital lines typically extend parallel to the sense lines, and are used to initially help rotate the magnetic field vector of the memory cells during, for example, a write operation. This initial rotation of the magnetic field vector increases the torque that can be applied by the word line field during a write operation. Typically, both the digital line and the word line must be asserted to write a corresponding magnetic bit within the memory. Therefore, the digital line can be used to select whether a read or a write operation is performed. For example, when only the word line is asserted, a read operation is performed. When both the word line and digital line are asserted, then a write operation is performed.

A number of competing factors influence the packing density that can be achieved in a typical memory. One factor is the width and thickness of the word lines, and where applicable, digital lines. The dimensions of the word lines and digital lines must typically decrease with increased packing density. Reducing the dimensions of the word lines and digital lines, however, tends to reduce the current that can be accommodated thereby, and thus the magnetic field that can be produced at the corresponding magnetic bit regions.

Another factor is the distance between the word lines and, where applicable, digital lines, and thus the distance between a word line and/or digital line and an adjacent memory cell. Typically, the distance between the word lines and the digital lines must decrease with increased packing density. However, this increases the likelihood that the magnetic field produced by one word line or digital line may adversely affect the information stored in an adjacent memory cell. This adverse interaction is often called cross-talk.

Since a magnetic memory operates with internally generated magnetic fields from word, sense, and digital lines, it is desirable to shield it from externally generated low frequency magnetic fields as well as EMI. One way to reduce the effects of externally generated fields on thin film magnetic memories is to provide a shield in the package that houses the memory. Shielded packages typically have a cavity for receiving the thin-film magnetic memory. A lower shielding layer is provided below the cavity, and an upper shielding layer is provided above the cavity, such as in or on the package lid. The upper and lower shielding layers are often formed from Mu metal or the like. In this configuration, the upper and lower shielding layers may help shunt externally generated fields, limiting their influence on the thin-film magnetic memory.

A limitation of using shielded packages is that the shielding layers may not protect the magnetic bits from internally generated fields, such as those produced by adjacent word or digital lines or the like. Instead, the upper and lower shielding layers of the package may actually increase or concentrate the internally generated fields at the magnetic bit in much the same way as a word line keeper increases or concentrates the magnetic field produced by a word line at the magnetic bit.

U.S. Pat. No. 5,039,655 to Pisharody discloses one approach for reducing internally generated noise, and more particularly, for reducing cross-talk between word lines and adjacent magnetic bits. In Pisharody, a magnetic field keeper formed from a superconductor material is provided around at least three sides of each word line. Pisharody states that the superconductor material shunts the magnetic fields generated by the adjacent word lines, thereby reducing the effects on adjacent memory cells.

A limitation of Pisharody is that only one side of each memory cell has a superconducting magnetic field keeper. Thus, the other side of each memory cell is left completely unprotected from stray fields. As such, magnetic fields that enter the memory from the non-word line side are not suppressed by the superconducting layer. Rather, the superconducting layer may actually increase or concentrate the fields at the magnetic bit regions in much the same way as a word line keeper increases or concentrates the magnetic field produced by a word line at the magnetic bit.

What would be desirable, therefore, is a monolithically formed thin-film magnetic memory that has local shielding on both sides of a magnetic bit to help protect the magnetic bit from external EMI, internally generated cross-talk, and other internally and externally generated noise.

SUMMARY OF THE INVENTION

The present invention overcomes many of the disadvantages of the prior art by providing a monolithically formed ferromagnetic thin-film memory that has local shielding on at least two sides of a magnetic bit region. The local shielding helps protect the magnetic bit from externally generated EMI, internally generated cross-talk, and other internally and externally generated noise. In addition, when the local shielding layers are provided adjacent a word line and/or digital line, the local shielding layers may help concentrate the magnetic fields of the word lines and/or digital lines at the magnetic bit regions, in much the same way as a magnetic field keeper. Accordingly, the shielding layers may not only help reduce undesirable fields from influencing the magnetic bit regions, but may also enhance the desirable magnetic fields at the magnetic bit regions.

In one illustrative embodiment, top and bottom shielding layers are provided above and below a conventional monolithically formed magneto-resistive memory element, although it is contemplated that any type of magnetic memory element may be used. The memory element is preferably formed on the underlayers of a conventional monolithic integrated circuit. This helps provide easy electrical interconnection between the memory cells and the memory operating circuitry on the monolithic integrated circuit. The shielding layers are also preferably monolithically formed.

In another illustrative embodiment, a word line is provided adjacent the memory elements, with a first shielding layer extending adjacent the word line. A second shielding layer is provided adjacent a digital line, which preferably extends along the other side of the memory elements. To help reduce internally generated cross-talk, the first and/or second shielding layers may extend along the side surfaces of the word line and/or digital line, respectively. As indicated above, this may enhance the desired magnetic fields at the memory element and reduce cross-talk.

To fabricate a preferred embodiment of the present invention, a base insulating layer is first provided over the underlayers of a monolithic integrated circuit. A cavity is then formed in the base insulating layer, wherein the cavity has a bottom surface and two spaced side surfaces. A lower shielding layer and a lower barrier layer are provided on the bottom and/or side surfaces of the cavity. A lower conductive material layer is then provided in the cavity and above the soft magnetic material layer and the barrier layer to substantially fill the cavity. The lower conductive material layer forms the word line structure.

A lower insulating layer is then provided over the word line structure. A magnetic bit region is formed on the lower insulating layer. An upper insulating layer is provided over the magnetic bit region. When a digital line is used, a conductive material layer is provided on the upper insulating layer, which is then patterned using conventional patterning techniques. A barrier layer can then be provided, followed by an upper shielding layer. The upper shielding layer may be provided along the top and/or sides of the digital line using conventional processing techniques. When no digital line is desired, the upper shielding layer may be applied directly to the upper insulating layer, if desired.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIGS. 4–18 illustrate a preferred method for forming a monolithic memory element with upper and lower shielding elements;

FIG. 4 a cross section of an insulating layer, preferably provided on conventional integrated circuit underlayers;

FIG. 5 is a cross section of the insulating layer of FIG. 4 with a patterned photoresist provided on the top surface thereof;

FIG. 6 is a cross section of the insulating layer of FIG. 5 after a cavity is etched therein, and after the patterned photoresist is removed;

FIG. 7 is a cross section of the insulating layer and cavity of FIG. 6 with the soft magnetic material layer deposited on the bottom surface of the cavity;

FIG. 8 is a cross section of the insulating layer and soft magnetic material layer of FIG. 7 with the conductive material layer deposited thereon;

FIG. 9 is a cross section of the insulating layer, soft magnetic material layer and conductive material layer of FIG. 7 with those portions that are above the top surface of the insulating layer removed;

FIG. 10 is a cross section of the insulating layer, soft magnetic material layer and conductive material layer of FIG. 9 with a thin insulating layer deposited thereon;

FIG. 11 is a cross section of the insulating layer, soft magnetic material layer, conductive material layer and thin insulating layer of FIG. 10 after the magnetic material is deposited and patterned thereon;

FIG. 12 is a cross section of the insulating layer and cavity of FIG. 6 with the soft magnetic material layer deposited on the bottom and side surfaces of the cavity;

FIG. 13 is a cross section of the insulating layer and soft magnetic material layer of FIG. 12 with the conductive material layer deposited thereon;

FIG. 14 is a cross section of the insulating layer, soft magnetic material layer and conductive material layer of FIG. 13 with those portions that are above the top surface of the insulating layer removed;

FIG. 15 is a cross section of the insulating layer, soft magnetic material layer and conductive material layer of FIG. 14 with a thin insulating layer deposited thereon;

FIG. 16 is a cross section of the insulating layer, soft magnetic material layer, conductive material layer and thin insulating layer of FIG. 15 after the magnetic bit region is deposited and patterned thereon;

FIG. 17 is a cross section of the insulating layer, soft magnetic material layer, conductive material layer, thin insulating layer, and magnetic bit region of FIG. 16, with another conductive material layer and another soft magnetic material layer deposited thereon;

FIG. 18 is a cross section of the embodiment of FIG. 17 taken along lines 18—18;

DETAILED DESCRIPTION OF THE PREFERRED EMBODIMENTS

Figures 1, 2, 3:
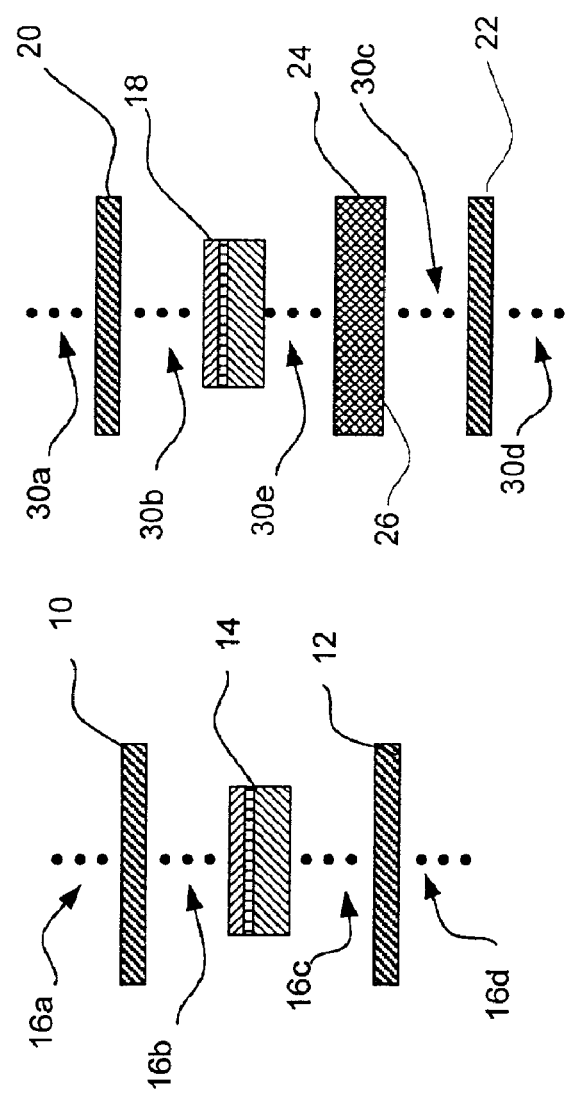
FIG. 1 is a cross section of a monolithically formed memory element having an upper shield and a lower shield.
FIG. 2 is a cross section of a monolithically formed memory element having an upper shield and a lower shield, with a word line positioned between the memory element and the lower shield.
FIG. 3 is a cross section of a monolithically formed memory element having an upper shield and a lower shield, with a word line positioned between the memory element and the lower shield and a digital line positioned between the memory element and the upper shield.

FIG. 1 is a cross section of a monolithic memory element that has an upper shield and a lower shield. The upper shield 10 is provided above memory element 14, and lower shield 12 is provided below memory element 14. It is contemplated that any type of magnetic memory element 14 may be used.

The memory element 14 is preferably formed above the underlayers of a conventional integrated circuit. This helps provide easy electrical interconnection between the memory cells and the memory operating circuitry on the monolithic integrated circuit. The shielding elements 10 and 12 are also preferably monolithically formed with the integrated circuit and the memory element 14.

The dots at 16b and 16c indicate that one or more layers may be interposed between the memory element 14 and the upper and lower shield elements 10 and 12, respectively. In the embodiment shown, all that is important is that at least two sides, such as the upper and lower sides of the memory element 14, are cladded with two shielding elements 10 and 12. Dots 16a indicate that one or more layers may be provided above the upper shield element 10, and dots 16d indicate that one or more layers may be provided below lower shield 12.

To provide a selection mechanism to the memory, a word line may be provided adjacent each memory element. For example, FIG. 2 shows a cross section of a memory element 18 with cladding upper and lower shielding elements 20 and 22, with a word line 24 positioned between the memory element 18 and the lower shield 22. It is recognized that the word line 24 may be positioned between the memory element 18 and the upper shield 20, if desired. The lower shield 22 is preferably positioned adjacent the word line 24 along the side 26 of the word line 24 that is away from the memory element 18.

The dots at 30b indicate that one or more layers may be interposed between the memory element 18 and the upper shield element 20. Likewise, dots 30c indicate that one or more layers may be interposed between the word line 24 and the lower shield element 22. Dots 30a indicate that one or more layers may be provided above the upper shield element 20, and dots 30d indicate that one or more layers may be provided below lower shield 22. Finally, dots 30e indicate that one or more layers may be provided between the word line 24 and the memory element 18.

As indicated above, some memories include a number of digital lines that extend generally parallel to the sense lines, and generally perpendicular to the number of word lines. The digital lines may be used to help initiate rotation of the magnetic field vector of the magnetic element during, for example, a write operation. The initial rotation of the magnetic field vector increases the torque that can be applied by the word line field during a write operation.

FIG. 3 is a cross section of a memory element 36 with cladding upper and lower shielding elements 38 and 40, with a word line 42 positioned between the memory element 36 and the lower shield 40 and a digital line 44 positioned between the memory element 36 and the upper shield 38. This configuration is only illustrative, and it is contemplated that the word line 42 may be positioned, for example, above the memory element 36, and the digital line 44 may be positioned below the memory element 36.

In this configuration, the local shielding elements 38 and 40 may help protect the memory element 36 from externally generated EMI, and may further help concentrate the magnetic fields produced by the word line 42 and digital line 44 to the memory element 36. Accordingly, the shielding layers may not only help reduce undesirable fields from influencing the magnetic bit regions, but may also help enhance the desired magnetic fields at the memory element 36.

Figure 4:
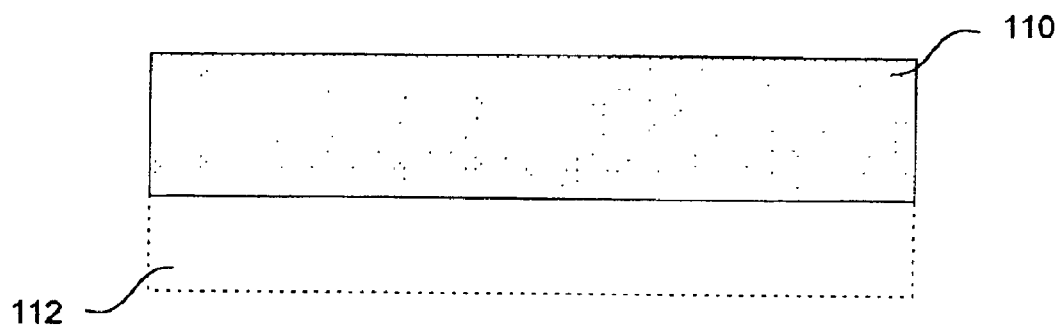

FIGS. 4–18 illustrate a preferred method for forming an illustrative monolithic memory element with upper and lower shields. FIG. 4 is a cross section of an insulating layer 10 such as silicon nitride or silicon oxide, preferably formed on conventional integrated circuit underlayers 112. The underlayers 112 may include, for example, all circuit layers for a conventional CMOS wafer up to the metal layers. The underlayers 112 are shown using a dashed line, and are not included in the subsequent figures for clarity.

Figure 5:
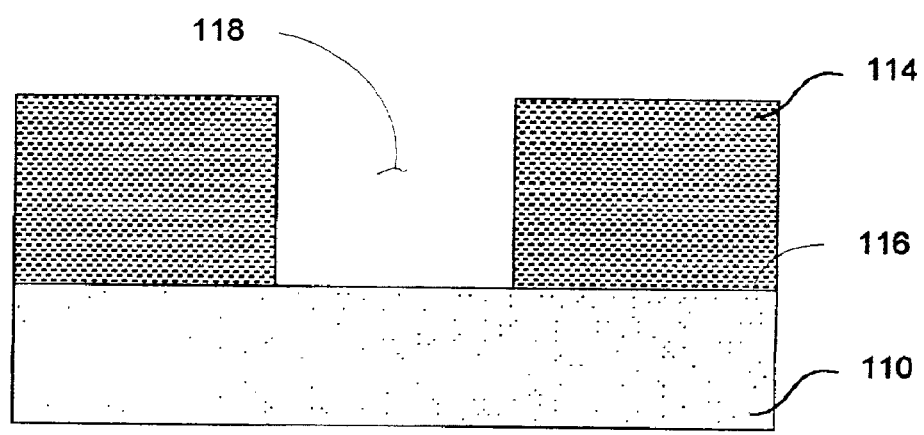
Figure 6:
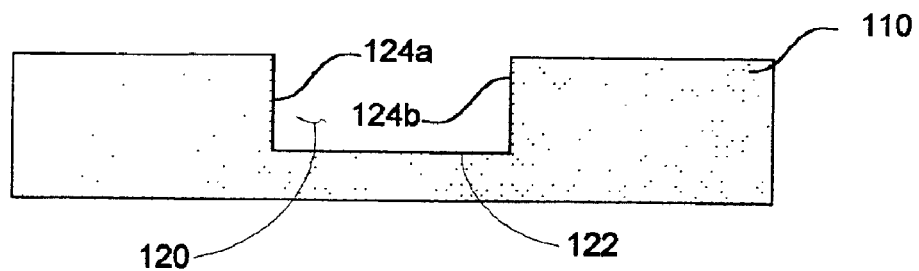

To form a cavity in the insulating layer 110, a photoresist layer 114 is provided on the top surface 116 of the insulating layer 110. The photoresist layer 114 is patterned in a conventional manner to selectively remove a portion 118 of the photoresist layer 114 which overlays the desired cavity, as shown in FIG. 5. The exposed portion of the insulating layer 110 is then etched using a conventional etching process to form cavity 120 as shown in FIG. 6. The cavity 120 has a bottom surface 122 and two spaced side surfaces 124a and 124b. The photoresist is subsequently removed.

Figure 7:
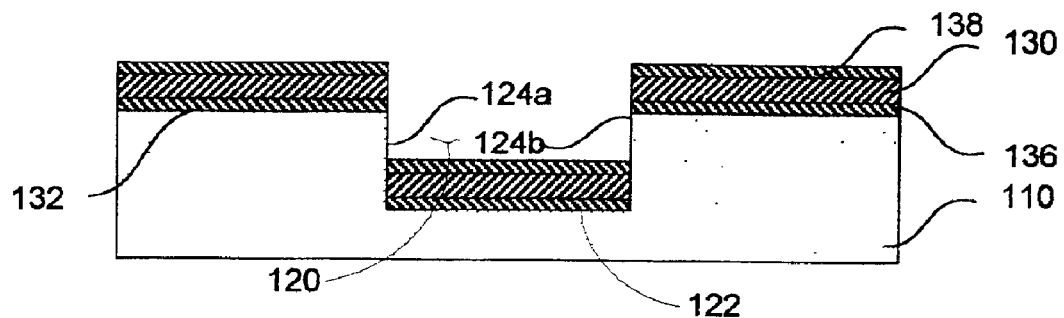

FIG. 7 is a cross section of the insulating layer 110 and cavity 120 of FIG. 6, with a soft magnetic material layer 130 deposited thereon. In the illustrative embodiment, the deposition of the soft magnetic material layer 130 only occurs on the horizontal surfaces of the insulating layer 110, including the bottom surface 122 of the cavity 120, and the remaining top surface 132 of the insulating layer 110. As can be seen, the soft magnetic material layer 130 preferably only partially fills the cavity 120.

The soft magnetic material layer 130 may include a first barrier layer 136, a second barrier layer 138 and a soft magnetic material 130 therebetween. The first and second barrier layers are preferably made from Ta, TiW, TiN, TaN, SiN, SiO2, or similar material. The soft magnetic material is preferably formed from NiFe, NiFeCo, CoFc, or other similar material having soft magnetic properties. It is contemplated that the first barrier layer 136, the second barrier layer 138 and soft magnetic material 130 may be deposited during a single conventional deposition process step, as is known in the art.

Figure 8:
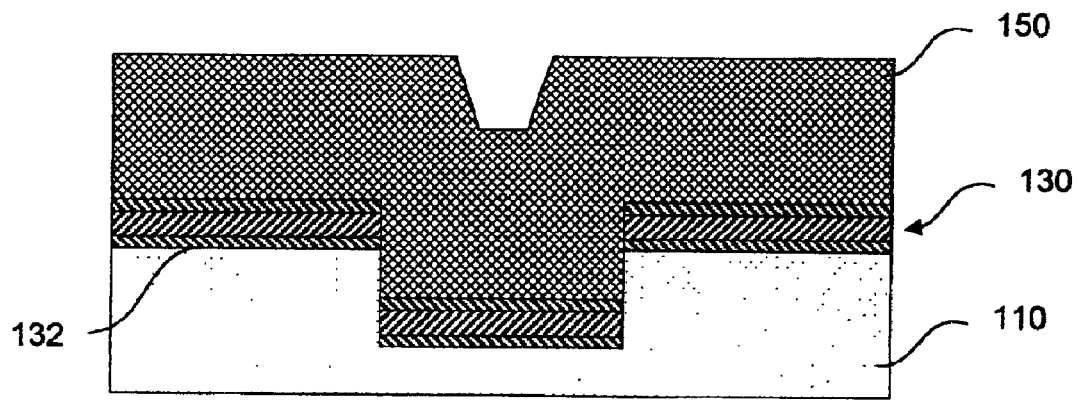

After the soft magnetic material layer 130 is deposited, a conductive material layer 150 is deposited on the top surface of the soft magnetic field layer 130. The conductive material layer 150 is deposited to at least substantially fill the cavity 120, and preferably covers the entire wafer including those portions of the soft magnetic material layer 130 that lie outside of the cavity 120 as shown in FIG. 8. Conductive material layer 150 is preferably formed from Cu or AlCu. As can be seen, the conductive material layer 150 is self-aligned with the soft magnetic field layer 130.

It is contemplated that a number of contacts or vias may be provided between selected underlayers and/or metal lines before and after the conductive material layer 150 is deposited. In one embodiment, each of the contacts/vias are filled with tungsten to reduce the resulting contact/via resistance. It is known that this may require relatively high processing temperatures. However, and in accordance with co-pending U.S. patent application Ser. No. 08/993,009, filed Dec. 18, 1997, and entitled "Self-Aligned Wordline Keeper and Method of Manufacture Therefor", the contact and via processing may be performed before the magnetic materials are provided, thereby preserving the magnetic properties of the magnetic materials.

Figure 9:
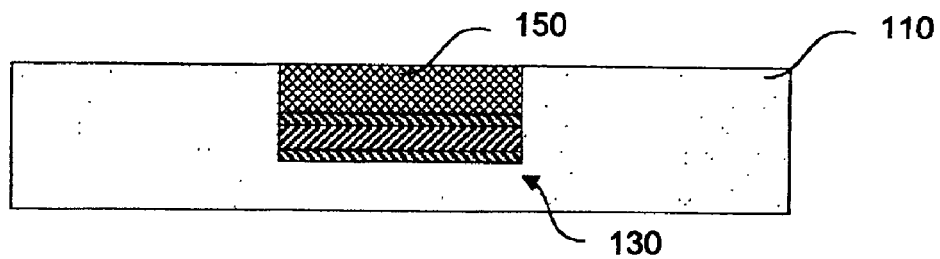

As can be seen, portions of the soft magnetic material layer 130 and conductive material layer 150 may lie above the top surface 132 of the insulating layer 110. In a preferred embodiment, these portions may be removed using a mechanical or chemical-mechanical polishing (CMP) process. FIG. 9 is a cross section showing the insulating layer 110, the soft magnetic material layer 130, and the conductive material layer 150 after the polishing step is completed.

Figure 10:
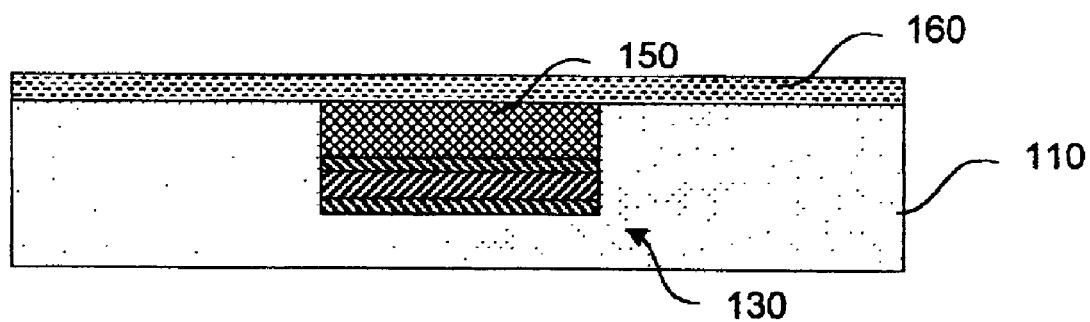

Polishing the top surface of the insulating layer to remove those portions of the soft magnetic material layer 130 and conductive material layer 150 that lie above the top surface of the insulating layer 110 provides a number of advantages. First, a relatively planer top surface is provided. This allows the deposition of a relatively thin insulating layer 160 as shown in FIG. 10, which increases the magnetic field produced by the conductive material layer 150 at bit region 170. Second, the conductive material layer 150 may be made from any type of material since mechanical and chemical-mechanical polishing are typically non-selective. Deposition/photoresist/etch processes typically are limited to the types of metals that can be used.

Figure 11:
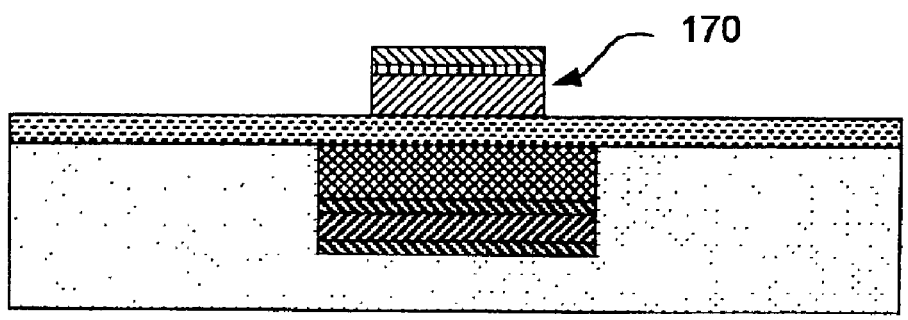

After polishing, a thin insulating layer 160 is preferably provided on the top surface of the insulating layer 110, and over the cavity 120, as shown in FIG. 10. A magnetic bit region 170 may then be deposited and patterned on the thin insulating layer 160 as shown in FIG. 11.

Bit region 170 may be a sandwich-type structure similar to that disclosed in commonly assigned U.S. Pat. No. 4,780,848 to Daughton et al., which is incorporated herein by reference. As further described in Daughton et al., bit region 170 may include a silicon nitride diffusion barrier layer of approximately 300 angstroms. A first layer of a 65% Ni, 15% Fe, and 20% Co Permalloy of 150 angstroms or less is then deposited. Next, a non-magnetic intermediate layer, such as TaN or Cu, is deposited to a thickness of 50 angstroms or less. Then a second layer of a Permalloy is deposited to a thickness of 150 angstroms or less. This is followed by depositing a second non-magnetic resistive layer of tantalum nitride or tantalum to a thickness of 50–1000 angstroms. A capping, or etch stop, layer of Chromium silicon (CrSi) is then deposited to a thickness in the range of 100 to 1500 angstroms. All of the depositions of bit region 170 are preferably done in-situ. The deposition of the Permalloy layers are done in the presence of a bias magnetic field.

Figure 12:
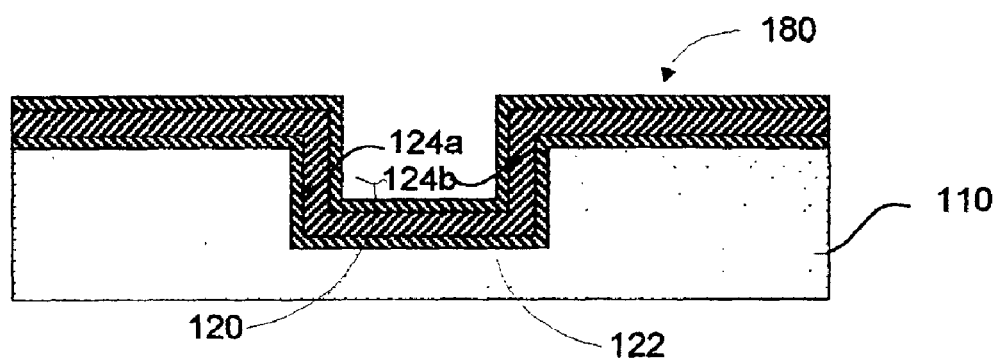
Figure 13:
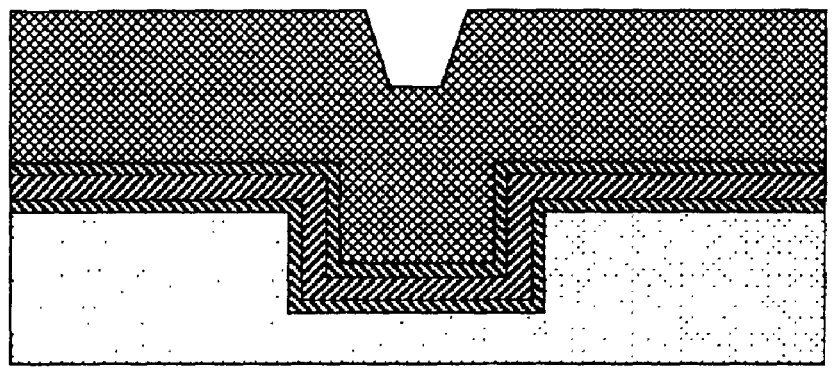
Figure 14:
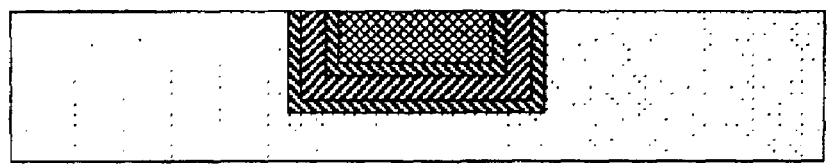
Figure 15:
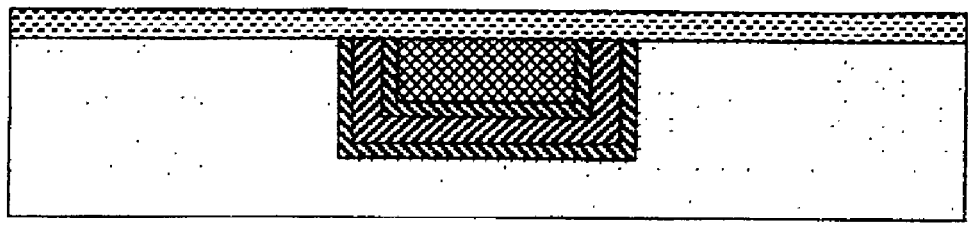
Figure 16:
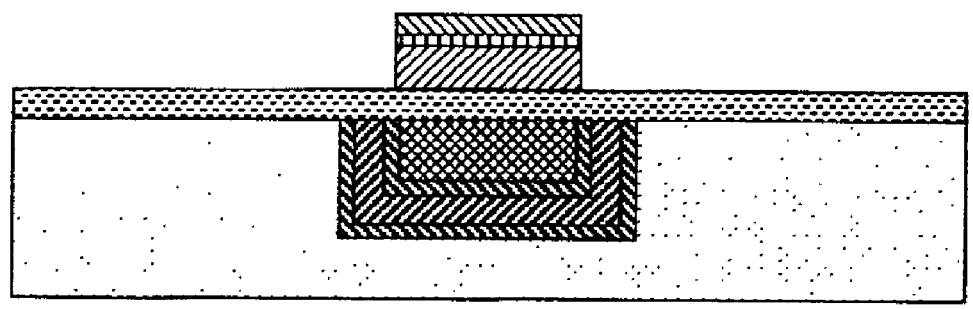

FIG. 12 shows an alternative embodiment of the present invention where the soft magnetic material layer 180 is deposited on the bottom 122 and side surfaces 124a and 124b of the cavity 120. This can be accomplished by using a deposition process that covers both horizontal and vertical surfaces of insulating layer 110, as is known in the art. The remaining fabrication steps shown in FIGS. 13–16 are similar to those described above with reference to FIGS. 8–11, respectively.

The preferred embodiment preferably includes a number of digital lines extending generally perpendicular to the word lines. The digital lines are used to help initiate rotation of the magnetic field vector of the magnetic bit region during, for example, a write operation. This initial rotation of the magnetic field vector increases the torque that can be applied by the word line field during the write operation.

To form the digital line, an insulating layer 184 is first provided over the memory element 170, as shown in FIG. 17. A conductive material layer 186 is then provided on insulating layer 184, which is then patterned using conventional patterning techniques. A shielding element 188 is then provided over the conductive material layer 186. It is contemplated that the shielding element 188 may include one or more barrier layers, as described above.

Preferably, the shielding element 186 extends along the top and side walls of the digital line 186, as more clearly shown in FIG. 18. By including the shielding element 186 on the side walls as shown, the effect of the magnetic fields produced by adjacent digital lines on adjacent memory elements may be reduced. If no digital line is desired, shielding element 188 may be applied directly to the upper insulating layer 184.

Figure 19:
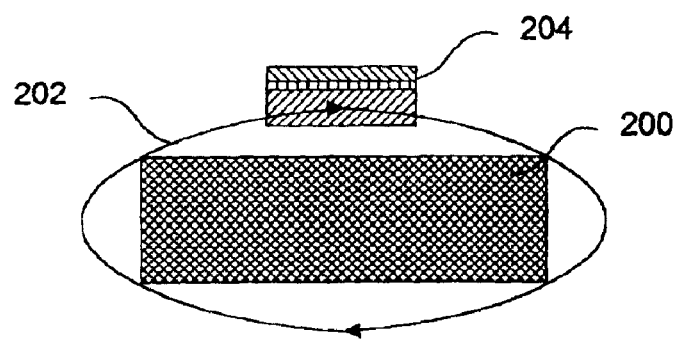
FIG. 19 is a schematic diagram showing an illustrative magnetic field produced by a word line or digital line with no magnetic field keeper.

FIG. 19 is a schematic diagram showing an illustrative magnetic field produced by a word line or digital line 200 with no shield. The word line or digital line 200 is carrying a current into the page to produce a magnetic field 202. The magnetic field 202 is shown extending symmetrically around word line or digital line 200 and intersecting a bit region 204.

Figure 20:
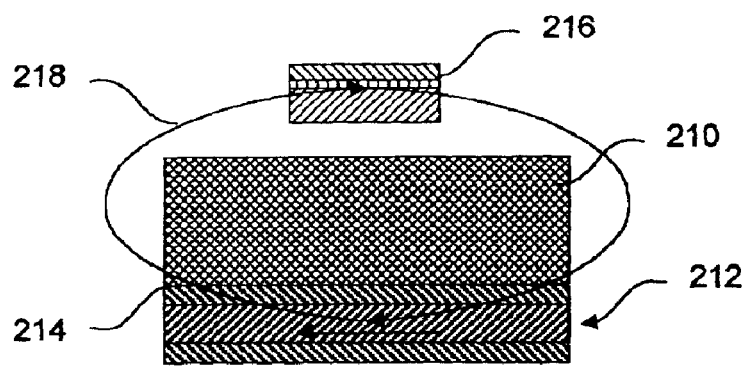
FIG. 20 is a schematic diagram showing an illustrative magnetic field produced by a word line or digital line with a magnetic field keeper extending along one side thereof.

FIG. 20 is a schematic diagram showing an illustrative magnetic field produced by a word line or digital line 210 with a shield 212 adjacent the bottom surface 214 thereof. Upon application of current in the word line or digital line 210, the soft magnetic material in shield 212 aligns as shown, and helps concentrate the magnetic field 218 above the word line or digital line 210. This helps increase the magnetic field 218 at a bit region 216.

Figure 21:
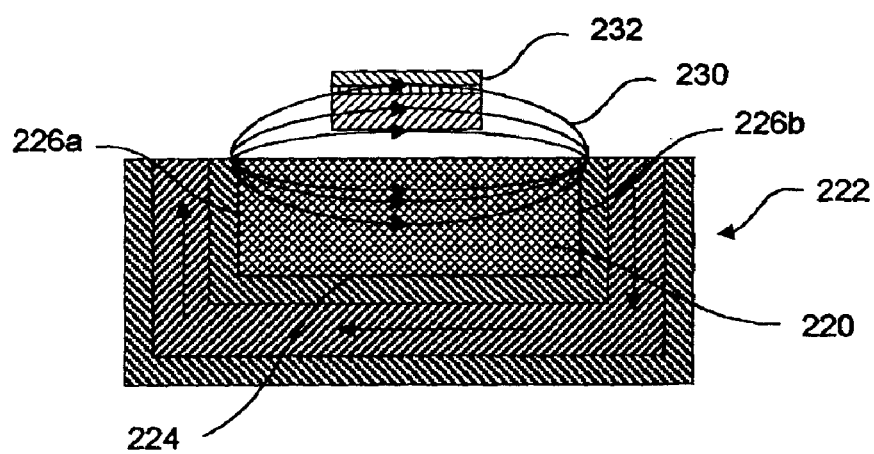
FIG. 21 is a schematic diagram showing an illustrative magnetic field produced by a word line or digital line with a magnetic field keeper extending along the underside and side walls thereof.

FIG. 21 is a schematic diagram showing an illustrative magnetic field produced by a word line or digital line 220 with a magnetic field keeper 222 adjacent the bottom surface 224 and side walls 226a and 226b thereof. Upon application of current in the word line or digital line 220, the soft magnetic material in shield 222 aligns as shown. By providing a shielding element on the side walls 226a and 226b, the magnetic field 230 is even more effectively concentrated adjacent the word line or digital line 220, thereby further increasing the magnetic field 230 at a bit region 232.

In addition to helping concentrate the word line and digital line fields, the shielding elements may help shunt any externally generated fields from reaching the thin-film magnetic memory. This may reduce the sensitivity of the memory elements to external fields, which may increase the reliability of the device.

It is contemplated that the upper and lower shields of the present invention may also be used in conjunction with magnetic field sensor devices. Magnetic field sensor devices often include a magneto-resistive material in the sensor element. Generally, by measuring the resistance change of the magneto-resistive material, the magnitude of the incident magnetic field can be determined. The shielding elements of the present invention may improve the performance of these sensor devices.

In most cases, the magneto-resistive material has edge domains that are magnetized in a particular direction, regardless of whether the incident magnetic field is applied. Under some circumstances, the direction of the magnetization field in one or more of the edge domains can become reversed. This can happen, for example, when the incident magnetic field exceeds a maximum threshold. Under these circumstances, the edge domains typically must be reset before the magnetic field sensor can resume normal operation. The edge domains are typically reset using a reset line that is placed adjacent to the magnetic field sensor. Accordingly, it is contemplated that a reset line of a magnetic field sensor device may include the above-described magnetic shield elements on either side thereof to increase the magnetic field produced by the reset line at the magnetic material of the sensor device, and to reduce the effects of externally generated fields.

Having thus described the preferred embodiments of the present invention, those of skill in the art will readily appreciate that the teachings found herein may be applied to yet other embodiments within the scope of the claims hereto attached.

What is claimed is:

1. A monolithically formed ferromagnetic thin film memory element comprising:

magnetic storage means having an upper surface and a lower surface;

a word line having an inner surface and an outer surface;

a digital line having an inner surface and an outer surface, the inner surface of said digital line spaced from the inner surface of said word line, with the magnetic storage means positioned therebetween;

first shielding means having a soft magnetic material, said first shielding means positioned above the upper surface of the magnetic storage means and adjacent the outer surface of the word line; and second shielding means having a soft magnetic material, said second shielding means positioned below the lower surface of the magnetic storage means and adjacent the outer surface of the digital line.

2. A monolithically formed ferromagnetic thin film memory element according to claim 1, further comprising a first barrier means situated between said first shielding means and the outer surface of said word line.

3. A monolithically formed ferromagnetic thin film memory element according to claim 2, further comprising a second barrier means situated between said second shielding means and the outer surface of said digital line.

4. A monolithically formed ferromagnetic thin film memory element according to claim 3, wherein the word line has two opposing side surfaces extending between the inner surface and the outer surface thereof, said first shielding means also extending adjacent the two opposing side surfaces of said word line.

5. A monolithically formed ferromagnetic thin film memory element according to claim 4, wherein said digital line has two opposing side surfaces extending between the inner surface and the outer surface thereof, said second shielding means also extending adjacent the two opposing side surfaces of said digital line.

6. A monolithically formed ferromagnetic thin film memory element according to claim 2, further comprising a first insulating means situated between said magnetic storage means and the inner surface of said word line.

7. A monolithically formed ferromagnetic thin film memory element according to claim 6, further comprising a second insulating means situated between said magnetic storage means and the inner surface of said digital line.

8. A monolithically formed magneto-resistive memory element, comprising:

a word line having an inner surface and an outer surface;

a digital line having an inner surface and an outer surface, the inner surface of said digital line spaced from the inner surface of said word line;

a magnetic bit region between the inner surface of said word line and the inner surface of said digital line;

a first shielding layer having a soft magnetic material, the first shielding layer positioned adjacent the outer surface of the word line; and a second shielding layer having a soft magnetic material, the second shielding layer positioned adjacent the outer surface of the digital line.

9. A monolithically formed magneto-resistive memory element according to claim 8, further comprising a first barrier layer between said first shielding layer and the outer surface of said word line.

10. A monolithically formed magneto-resistive memory element according to claim 9, further comprising a second barrier layer between said second shielding layer and the outer surface of said digital line.

11. A monolithically formed magneto-resistive memory element according to claim 8, wherein the word line has two opposing side surfaces extending between the inner surface and the outer surface thereof, said first shielding layer also extending adjacent the two opposing side surfaces of said word line.

12. A monolithically formed magneto-resistive memory element according to claim 8, wherein said digital line has two opposing side surfaces extending between the inner surface and the outer surface thereof, said second shielding layer also extending adjacent the two opposing side surfaces of said digital line.

13. A monolithically formed magneto-resistive memory element according to claim 8, further comprising a first insulating layer between said magnetic bit region and the inner surface of said word line.

14. A monolithically formed magneto-resistive memory element according to claim 13 further comprising a second insulating layer between said magnetic bit region and the inner surface of said digital line.

15. A monolithically formed magneto-resistive memory element according to claim 8, wherein the word line is positioned below said magnetic bit region and said digital line is positioned above said magnetic bit region.

16. A monolithically formed magneto-resistive memory element according to claim 15, further comprising a lower insulating layer positioned below the magnetic bit region, the lower insulating layer having a cavity formed therein, wherein the cavity has a bottom surface and two spaced side surfaces, the first shielding layer having an inner surface and an outer surface, wherein the outer surface of the first shielding layer is adjacent the back surface of the cavity, and the outer surface of said word line is positioned adjacent the inner surface of the first shielding layer.

17. A monolithically formed magneto-resistive memory element according to claim 16, further comprising a first barrier layer between said first shielding layer and the outer surface of said word line.

18. A monolithically formed magneto-resistive memory element according to claim 17, wherein the inner surface of the word line substantially lies in the plane formed by the upper surface of the lower insulating layer.

19. A monolithically formed magneto-resistive memory element according to claim 18, further comprising a first insulating layer between the inner surface of the word line and the magnetic bit region.

20. A monolithically formed magneto-resistive memory element according to claim 19, further comprising a second insulating layer between the inner surface of the digital line and the magnetic bit region.

21. A monolithically formed magneto-resistive memory element according to claim 20, further comprising a second barrier layer between said second shielding layer and the outer surface of said digital line.

* * * * *